(12) United States Patent
Chen et al.

(10) Patent No.: US 6,828,663 B2
(45) Date of Patent: Dec. 7, 2004

(54) METHOD OF PACKAGING A DEVICE WITH A LEAD FRAME, AND AN APPARATUS FORMED THEREFROM

(75) Inventors: Tong Chen, Mountain View, CA (US); Suchet P. Chai, San Jose, CA (US)

(73) Assignee: Teledyne Technologies Incorporated, Los Angeles, CA (US)

( * ) Notice: Subject to any disclaimer, the term of this patent is extended or adjusted under 35 U.S.C. 154(b) by 0 days.

(21) Appl. No.: 09/801,339

(22) Filed: Mar. 7, 2001

(65) Prior Publication Data

US 2002/0125553 A1 Sep. 12, 2002

(51) Int. Cl.[7] .............................................. H01L 23/02
(52) U.S. Cl. ...................... 257/678; 257/666; 257/684; 257/704; 438/106; 438/121; 438/125
(58) Field of Search ................................. 257/678–737, 257/434, 680, 660, 754, 88, 89, 98, 100, 431–435, 666; 313/485, 486, 501–504; 250/208.1, 216, 226, 229; 438/106, 121, 125

(56) References Cited

U.S. PATENT DOCUMENTS

| | | | |
|---|---|---|---|
| 3,423,638 A | | 1/1969 | Dix et al. |
| 4,907,065 A | * | 3/1990 | Sahakian ..................... 357/68 |
| 4,967,260 A | | 10/1990 | Butt |
| 4,974,057 A | | 11/1990 | Tazima |
| 5,097,318 A | * | 3/1992 | Tanaka et al. ................ 357/74 |
| 5,300,791 A | * | 4/1994 | Chen et al. ................... 257/94 |
| 5,311,402 A | * | 5/1994 | Kobayashi et al. ......... 361/760 |
| 5,477,081 A | | 12/1995 | Nagayoshi |
| 5,598,034 A | * | 1/1997 | Wakefield ................... 257/706 |
| 5,623,123 A | | 4/1997 | Umehara |
| 5,644,169 A | * | 7/1997 | Chun ........................ 257/787 |
| 5,723,904 A | * | 3/1998 | Shiga ......................... 257/698 |
| 5,736,783 A | | 4/1998 | Wein et al. |
| 5,753,857 A | * | 5/1998 | Choi ......................... 174/52.4 |
| 5,832,598 A | | 11/1998 | Greenman et al. |
| 5,998,862 A | * | 12/1999 | Yamanaka .................. 257/434 |
| 5,998,877 A | | 12/1999 | Ohuchi |
| 6,008,534 A | | 12/1999 | Fulcher |
| 6,069,027 A | | 5/2000 | Mertol et al. |
| 6,087,716 A | | 7/2000 | Ikeda |
| 6,124,636 A | | 9/2000 | Kusamitsu |
| 6,137,168 A | | 10/2000 | Kirkman |
| 6,140,710 A | | 10/2000 | Greenberg |
| 6,157,080 A | | 12/2000 | Tamaki et al. |
| 6,157,085 A | | 12/2000 | Terashima |
| 6,169,323 B1 | | 1/2001 | Sakamoto |
| 6,274,927 B1 | * | 8/2001 | Glenn ........................ 257/680 |
| 6,353,257 B1 | * | 3/2002 | Huang ........................ 257/704 |
| 6,358,773 B1 | * | 3/2002 | Lin et al. .................... 438/106 |
| 2002/0030269 A1 | * | 3/2002 | Ammar ...................... 257/704 |

FOREIGN PATENT DOCUMENTS

| | | | | |
|---|---|---|---|---|
| EP | 0 393 584 A2 | | 10/1990 | |
| EP | 0 617 465 A1 | | 9/1994 | |
| JP | 403048448 | * | 3/1991 | ................ 257/703 |
| WO | WO 00/07239 | | 7/1999 | |

* cited by examiner

Primary Examiner—David Nelms
Assistant Examiner—Long Tran
(74) Attorney, Agent, or Firm—Kirkpatrick & Lockhart LLP

(57) ABSTRACT

A method of packaging a device and an apparatus formed by the method. According to one embodiment, the apparatus includes a base connected to the device, and a cover. The cover includes an injection molded plastic body and at least one electrically conductive lead. The body of the cover is connected to the base such that the device is enclosed by the cover, and the electrically conductive lead includes an exposed portion that is electrically connected to the device.

22 Claims, 5 Drawing Sheets

METHOD OF PACKAGING A DEVICE WITH A LEAD FRAME, AND AN APPARATUS FORMED THEREFROM

BACKGROUND OF INVENTION

1. Field of Invention

The present invention relates generally to device packaging and, more particularly, to lead frame packaging.

2. Description of the Background

Conventional semiconductor chip packaging techniques are not ideal for RF or microwave circuits. For example, with conventional semiconductor chip packaging techniques, an injection molded plastic package is molded onto the surface of the chip. A majority of microwave circuit chips, however, are fabricated from a gallium arsenide (GaAs) substrate, which is generally thin and fragile. Therefore, when the plastic is molded onto the surface of a GaAs microwave chip, it may damage the chip mechanically. In addition, microwave chips often include air bridges. Because plastic is a dielectric, molding plastic onto the surface of the chip may also have the effect of detuning the circuit. Another drawback of conventional semiconductor processing techniques is that the leads are typically not designed for controlled impedances. Impedance matching of the leads, however, is critical for high performance RF and microwave circuits. A further drawback of conventional semiconductor packaging techniques is that the plastic used for the packaging is very lossy at high frequencies, which may cause significant performance degradation in RF and microwave circuits.

Another problem with conventional semiconductor packaging techniques is wire bonding. Wire bonding is typically used to provide electrical connections between bonding pads of the chip and the leads of the package. Current wire bonding technology, however, prevents wire bonds from being formed that are less than about ten mils long. This drawback, coupled with the fact that wire bonds cannot be formed with acceptably tight tolerances at such dimensions, often results in unpredictable and/or unacceptable transmission characteristics for microwave devices.

In view of these drawbacks, some microwave device manufacturers have mounted microwave circuits using flip chip technology. Flip chip mounting has found wide application in the semiconductor packaging and assembly industry for digital and low frequency analog chips because it typically provides a cost and size reduction for the resulting semiconductor package. In contrast to the conventional wire bonding interconnect approach, the flip chip mounting technique involves flipping the chip and connecting the chip's top surface to the substrate. A number of electrically conductive flip chip bumps, depending upon the complexity of the chip, are typically provided between the chip's top surface and the substrate to provide an electrical connection between the chip and the substrate, and hence the other components connected to the top surface of the substrate.

In the microwave industry, however, because of difficulties in matching the orientation of the transmission mode fields for the circuits and the substrate, efforts to incorporate flip chip mounting have been primarily limited to devices employing co-planar waveguide (CPW) structures as the transmission media. That is, the circuit and substrate are both designed to support CPW. Many, if not most, commercially available MMICs (monolithic microwave integrated circuits), however, are designed for microstrip transmission modes, and are therefore ill suited for CPW transmission structures. Accordingly, using flip chip technology for microwave devices has ordinarily necessitated redesign or modification of existing microwave circuits to make them compatible with CPW. In addition, the CPW structure has the drawback that it typically requires the use of wire bonding to balance the ground strips of the CPW transmission line structure.

Accordingly, there exists a need for a lead frame package that provides the mechanical and electrical qualities necessary for high performance RF and microwave semiconductor devices, as well as for other types of devices. There further exists a need for such a package to be cost effective, both in terms of materials and assembly.

BRIEF SUMMARY OF THE INVENTION

The present invention is directed to a method of packaging a device as well as an apparatus formed by the method. According to one embodiment, the apparatus includes a base connected to the device, and a cover. The cover includes a plastic body and at least one electrically conductive lead. The body of the cover is connected to the base such that the device is enclosed by the cover, and the electrically conductive lead includes an exposed portion that is electrically connected to the device.

According to another embodiment, the apparatus includes a device connected to an electrically conductive baseplate, and a cover. The cover includes a plastic body and at least one electrically conductive lead. The body of the cover is connected to the baseplate such that the device is enclosed by the cover, and the electrically conductive lead includes an exposed portion that is connected to the device via an electrically conductive bump.

The method, according to one embodiment, includes attaching the device to a base, and attaching the base to a cover, the cover including a plastic body and at least one electrically conductive lead, such that the body encloses the device and such that the exposed portion of the lead is electrically connected to the device.

In contrast to conventional semiconductor packaging techniques, the present invention provides a lead frame package that realizes the mechanical and electrical qualities necessary for high performance RF and microwave semiconductor. For example, the package of the present invention may provide an air gap that is ideally suited for devices requiring free spaces. In addition, embodiments of the present invention contemplate the use of materials that are ideally suited for high frequency applications, such as a low loss liquid crystal polymer injection molded plastic cover and a baseplate having a coefficient of thermal expansion (CTE) that matches the substrate material of the device. Furthermore, the leads of the package may be configured to provide controlled matching for high frequency applications. In addition to these performance benefits, the present invention provides cost advantages. The materials are relatively inexpensive, and the assembly process is ideally suited for high volume production and automation. These and other benefits of the present invention will be apparent from the detailed description hereinbelow.

BRIEF DESCRIPTION OF THE DRAWINGS

For the present invention to be clearly understood and readily practiced, the present invention will be described in conjunction with the following figures, wherein.

DETAILED DESCRIPTION OF THE PRESENT INVENTION

Figure 1:
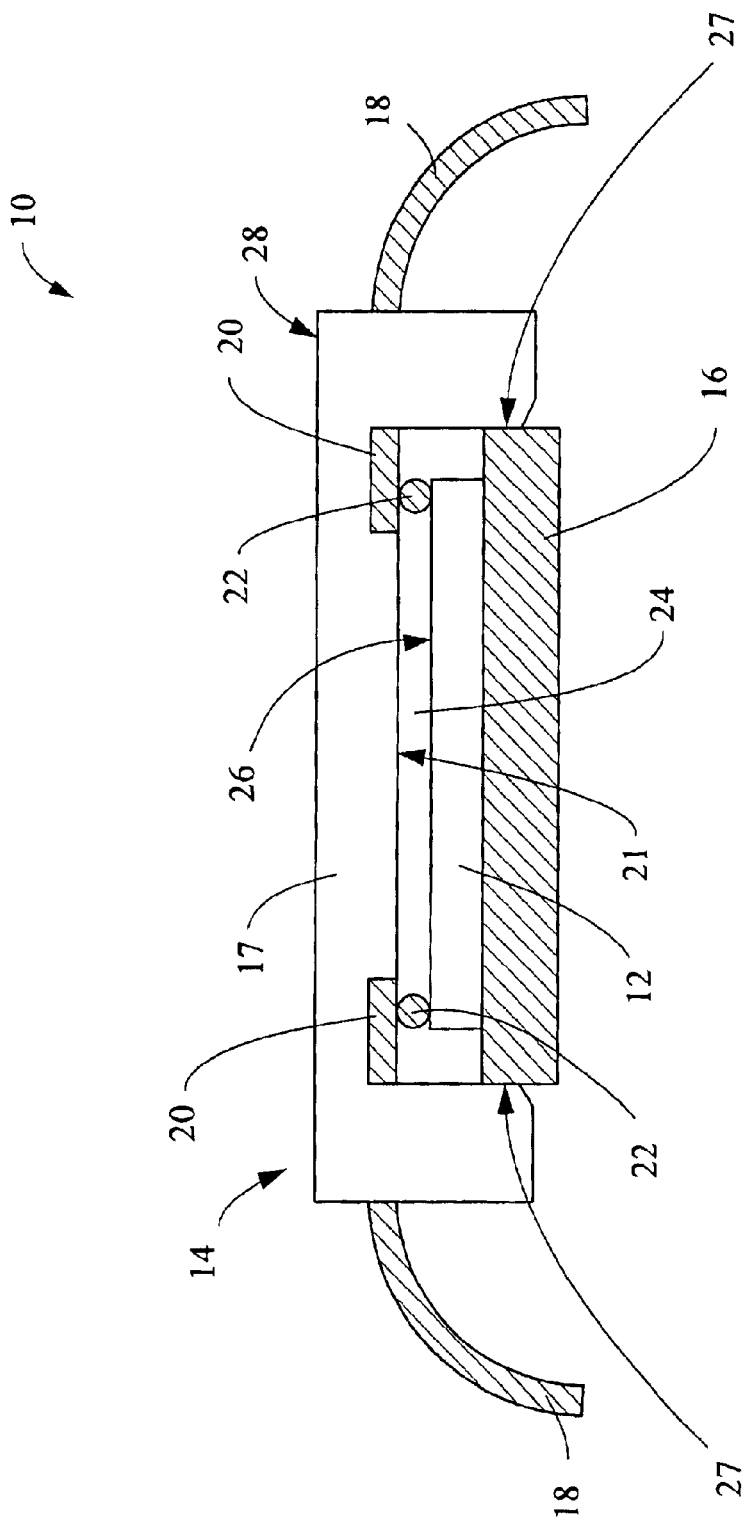
FIG. 1 is a cross-sectional diagram of an apparatus according to one embodiment of the present invention.

FIG. 1 is a cross-sectional diagram of an apparatus 10 according to one embodiment of the present invention. The apparatus 10 includes a device 12, a cover 14, and a baseplate 16. The cover 14 includes a body 17 and a number of electrically conductive leads 18 captured therein. Although only two are shown in FIG. 1, the apparatus 10 may include as many leads 18 as are necessary to provide the appropriate external connections for the device 12. As described further hereinbelow, the body 17 may be fabricated from injection molded plastic with the leads 18 captured therein, such that a portion 20 of the leads 18 are exposed on the inner surface 21 of the body 17 of the cover 14. In addition, the apparatus 10 includes electrically conductive bumps 22 mounted to the bonding pads of the device 12. The exposed portions 20 of the leads 18 are in electrical contact with the bonding pads of the device 12 via the bumps 22. The resulting air gap 24 between the upper surface 26 of the device 12 and the inner surface 21 of the body 17 makes the apparatus 10 well suited for applications requiring free spaces, such as, for example, when the device 12 is a microwave device. The air gap 24 may be filled with air, any other gas, or combination of gases.

The device 12 may be a semiconductor or a non-semiconductor device. For an embodiment in which the device 12 is a semiconductor device, the device 12 may be a chip fabricated from, for example, a silicon or gallium arsenide substrate, and may be, for example, a conventional integrated circuit (IC), an RF device, or a microwave device, such as a MMIC (monolithic microwave integrated circuit). For an embodiment in which the device 12 is a non-semiconductor device, the device 12 may be, for example, a MIC (microwave integrated circuit) fabricated from ceramic material such as, for example, $Al_2O_3$, AlN, or BeO. In addition, the device 12 may also be a power device such as, for example, a power amplifier. According to other embodiments, the device 12 may be a MEMS (micro electromechanical systems) device, an optoelectronic device, a crystal device, or an acoustic wave device. According to other embodiments, the device 12 may be, for example, a capacitor.

The body 17 of the cover 14 may be formed from injection molded plastic. The leads 18 may be captured in the body 17 such that the exposed portions 20 of the leads 18 are exposed on the inner surface 21 of the body 17 of the cover 14. The exposed portions 20 of the leads 18 may be configured to correspond to the bonding pad locations on the device 12. In addition, the inner surface 21 of the body 17 may have sidewalls 27 connected to the base 16 by, for example, epoxy as discussed further hereinbelow. According to another embodiment, the body 17 of the cover 14 may additionally include a lip (not shown) that is connected to an upper surface of the base 16.

The body 17 may be fabricated from any material suitable for injection molding, including materials that have low electrical loss at high frequency. For example, according to one embodiment, the body 17 may be fabricated from liquid crystal polymer (LCP), a relatively low loss material at microwave frequencies. In addition, according to another embodiment, the body 17 may include a metallization layer (not shown) on its outer surface 28 to minimize radiation. According to yet another embodiment, the cover 14 may be configured to include a layer of absorbing material (not shown) in the body 17 of the cover 14 to prevent coupling.

As described further hereinbelow, the device 12 is attached to the baseplate 16. The baseplate 16 may be made of an electrically conductive material such as, for example, copper, aluminum, or a metal matrix composite. Therefore, for an embodiment in which the device 12 is a microwave device, such as MMIC, the baseplate 16 may act as a ground. For an embodiment in which the device 12 is a power device, the baseplate 16 may be fabricated from a material that is thermally conductive as well, such as aluminum, to therefore act as a heat sink for the device 12. In addition, to provide improved mechanical performance, the baseplate 16 may have a coefficient of thermal expansion (CTE) that matches that of the device 12. For example, for an embodiment in which the device 12 includes a GaAs substrate, the baseplate 16 may include a low CTE material such as, for example, CuW or Cu/Mo/Cu. According to such an embodiment, the baseplate 16 may be attached to the device 12 using a eutectic die attach. According to other embodiments, such as when thermal and electrical properties of the baseplate 16 are not critical, the baseplate 16 may be fabricated from an insulative (i.e., dielectric) material such as, for example, plastic.

The leads 18 may have a variety of geometric formations, and may be made of any suitable electrically and thermally conductive material. For example, the leads 18 may be flat, they may be gull-wing shaped for, e.g., surface mount applications, or they may be bent backward underneath the cover 14 to thereby provide a leadless package. According to another embodiment, solder balls (not shown) may be attached to the leads 18 to provide a ball grid array (BGA) package.

The electrically conductive bumps 22 provide an electrical connection between the exposed portions 20 of the leads 18 and the bonding pads, or electrodes, of the device 12. The bumps 22 may be formed of, for example, metal, such as gold, or conductive polymers, and may have a diameter of approximately four mills or less.

Figure 2:
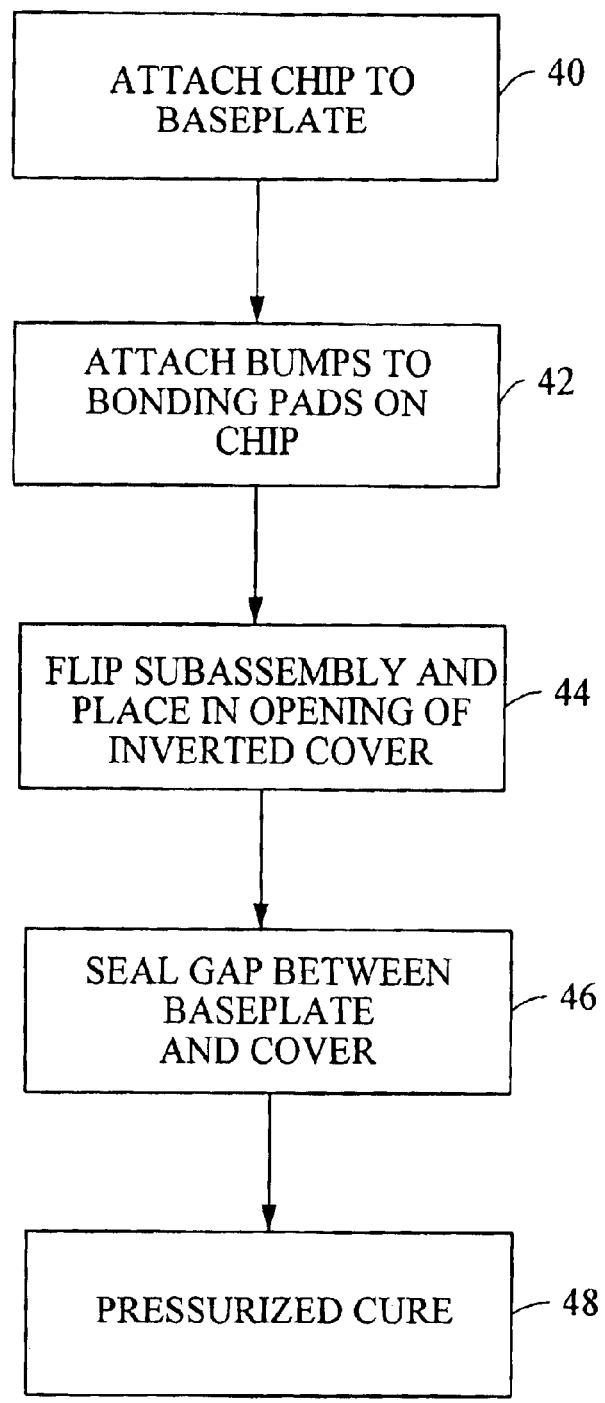
FIG. 2 is a diagram illustrating a method of fabricating the apparatus of FIG. 1 according to one embodiment of the present invention.

FIG. 2 is a flowchart of a process of making the apparatus 10 according to one embodiment of the present invention. The process initiates at block 40, where the device 12 is attached to the baseplate 16. According to one embodiment, the device 12 may be attached to the baseplate 16 using a conductive epoxy. From block 40 the process advances to block 42, where the electrically conductive bumps 22 are attached to the bonding pads of the device 12. According to one embodiment, the bumps 22 may be attached using ball bonders.

From block 42 the process advances to block 44, where the subassembly (i.e., the device 12, the baseplate 16, and the bumps 22) is flipped and placed in the opening revealed by an inverted cover 14. Prior to placing the subassembly in the cover 14, conductive epoxy is dispensed on the exposed portions 20 of the leads 18 to thereby facilitate attachment of the subassembly to the cover 14.

Next, at block 46, nonconductive epoxy is dispensed in the gaps between the baseplate 16 and the cover 14 to thereby seal the device 12 in the package. From block 46 the process advances to block 48, where the apparatus 10 is cured. During the curing, pressure may be applied to the baseplate 16 to facilitate bonding. In addition, one cure may only be required for both the conductive and nonconductive epoxy, although additional curing steps may be used if necessary. According to other embodiments, the bumps 22 may be bonded to the exposed portions 20 of the leads 18 using, for example, solder, thermal compression, or ultrasonic bonding.

The process just described is advantageously suited for large volume production and automation. According to one embodiment, the process may be implemented using a conventional pick-and-place machine to place the cover/baseplate subassembly in the opening of the inverted cover 14 although, according to other embodiments, a flip-chip automation process may be used.

Figure 3:
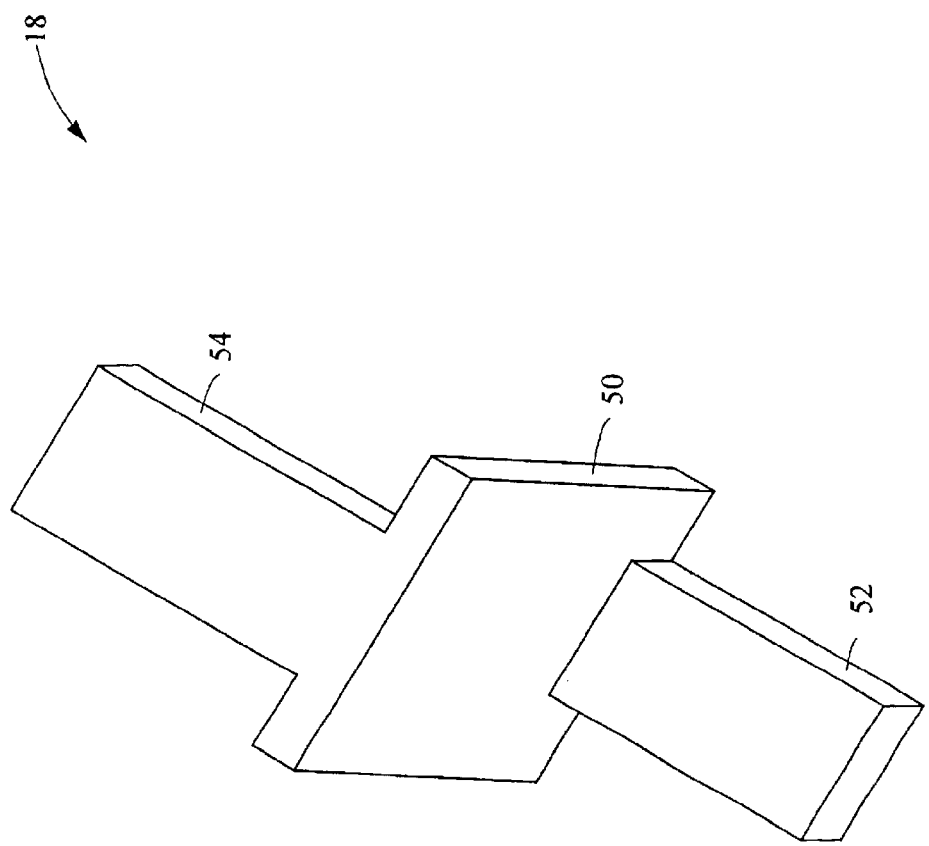
FIG. 3 is a perspective view of a lead of the apparatus of FIG. 1 according to one embodiment of the present invention.

For an embodiment in which the device 12 includes a microwave circuit, it should be noted that the leads 18 and the baseplate 16 form an essential geometry of microstrip lines. Consequently, according to one embodiment, the geometry of the leads 18 may be configured to provide adequate matching between the leads 18 and the bumps 22, which is critical at microwave frequencies. For example, by selecting the proper lead width, even using a stepped width configuration if necessary, reasonably good wide band or narrow band matching may be realized. FIG. 3 is a perspective view of a lead 18 according to such an embodiment. In the illustrated embodiment, the vertical portion 50 of the lead 18 is much wider than its horizontal portions 52, 54. For purposes of clarity, the body 17 portion of the cover 14 is not shown in FIG. 3. In addition, the horizontal portion 54 may include the exposed portion 22 of the lead 18, which is electronically connected to the device 12.

Figure 4:
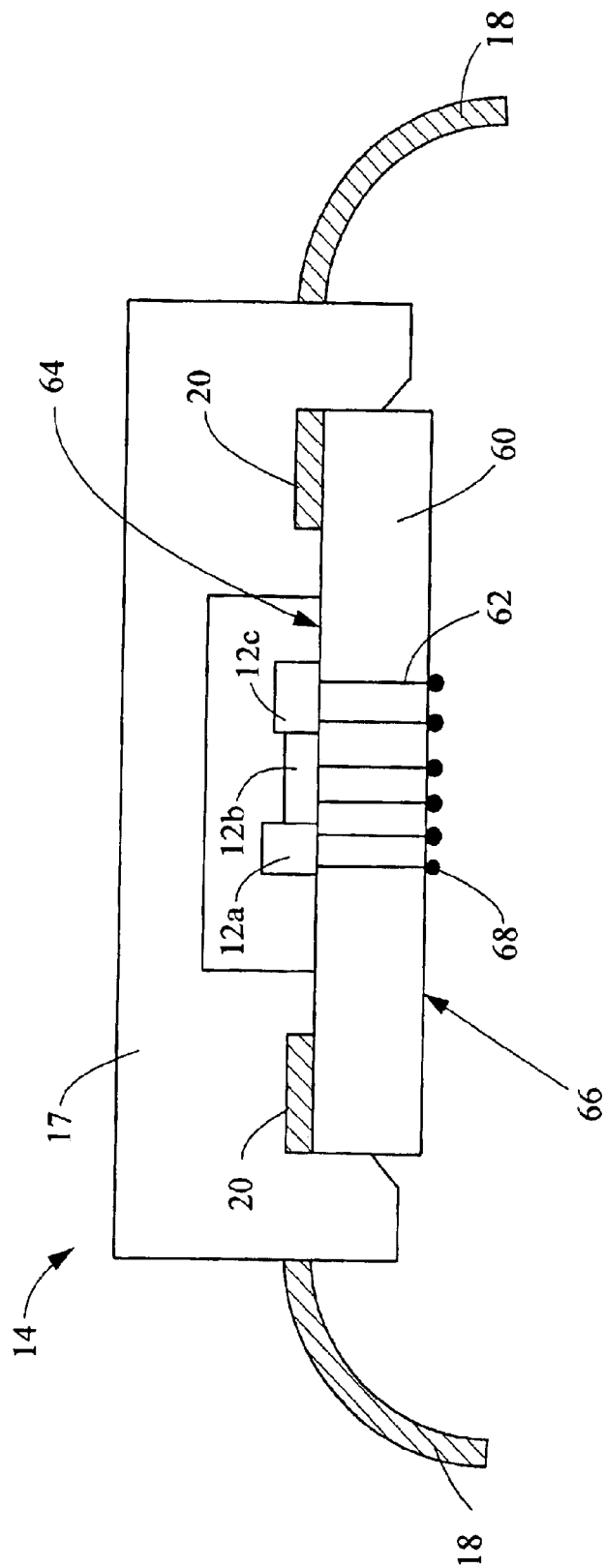
FIG. 4 is a cross-sectional diagram of the apparatus according to another embodiment of the present invention.

FIG. 4 is a cross-sectional diagram of the apparatus 10 according to another embodiment of the present invention. In FIG. 4, a number of devices 12a–c is fabricated on a substrate 60. According to another embodiment, some or all of the devices 12a–c may be attached to the substrate 60. The substrate 60 mechanically supports the body 17 portion of the cover 14, which is connected thereto. Also as illustrated in FIG. 4, the exposed portions 20 of the leads 18 are bonded directly to the bonding pads of the substrate 60, thus eliminating the conductive bumps 22. The exposed portions 20 of the leads 18 may be bonded to the substrate using, for example, conductive epoxy or solder. Such a configuration may be acceptable where the bonding pads are physically large enough that the bumps 22 are not needed.

According to another embodiment, as illustrated in FIG. 4, the substrate 60 may include one or more electrically conductive vias 62 extending from a bottom surface 64 of the substrate 60 to an upper surface 66 of the substrate 60. The vias 62 may be any suitable electrically conductive material including, for example, metal or conductive polymers, and may be formed in the substrate 60 using, for example, thick film techniques such as screen-printing. In addition, an electrically conductive ball 68 may be connected to each of the vias 62 by, for example, conductive epoxy, to also provide an external connection for the devices 12a–c according to a ball grid array (BGA) arrangement, for example.

Figure 5:
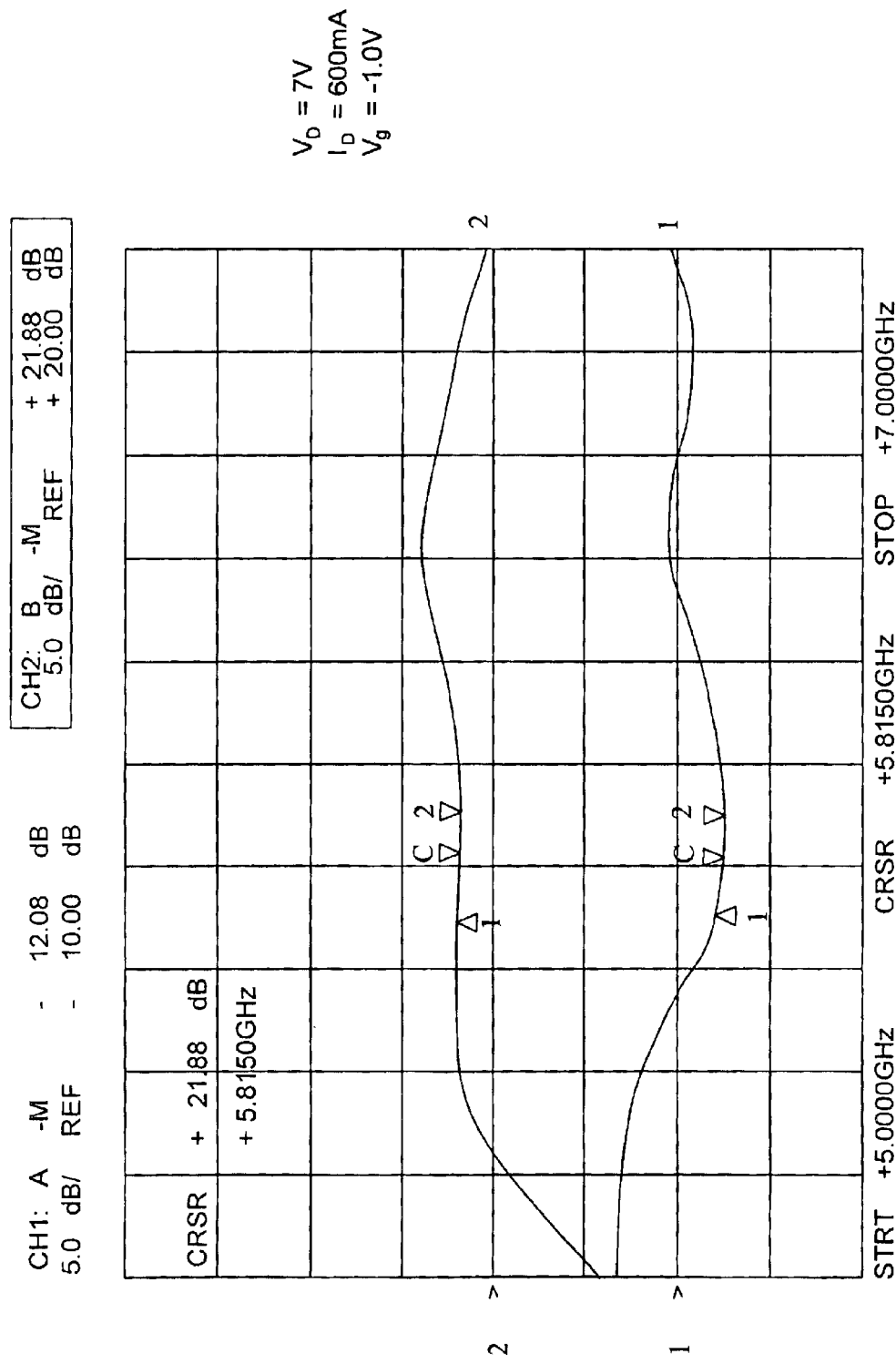
FIG. 5 is a graph illustrating the performance of the apparatus according to one embodiment of the present invention.

Embodiments of the present invention have been constructed and tested where the devices connected to the baseplate 16 include a C-band MMIC power amplifier with a gain of approximately 29 dBm and two by-pass capacitors. The baseplate 16 was fabricated from Cu/Mo/Cu with a gold-tin solder. The MMIC was electrically connected to the leads 18 using the conductive bumps 22, but the leads 18 for the capacitors were connected directly to the bonding pads for the capacitors using conductive epoxy. The body 17 portion of the cover 14 was constructed of LCP, and the leads 18 were copper. FIG. 5 is a graph illustrating the performance of the apparatus 10. Trace 2 of the graph illustrates that the apparatus 10 has a gain of approximately 22 dB for the frequency range of approximately 5.6 GHz to 6.8 GHz.

Although the present invention has been described herein with respect to certain embodiments, those of ordinary skill in the art will recognize that many modifications and variations of the present invention may be implemented. For example, the materials and processes disclosed are illustrative, but are not exhaustive. Other materials and processes may also be used to make devices embodying the present invention. In addition, the described sequences of the processing may also be varied. The foregoing description and the following claims are intended to cover all such modifications and variations.

What is claimed is:

1. An apparatus, comprising:
   a base;
   a device connected to the base; and
   a cover including a one-piece plastic body and at least one electrically conductive lead, wherein the body overlaps but is not directly connected to the base such that the device is enclosed by the body, and wherein the electrically conductive lead includes an exposed portion electrically connected to the device.

2. The apparatus of claim 1, wherein an inner surface of the body of the cover and an upper surface of the device define an air gap therebetween.

3. The apparatus of claim 2, wherein the inner surface of the body of the cover includes a sidewall connected to the base.

4. The apparatus of claim 1, wherein the base includes an electrically conductive baseplate on which the device is mounted.

5. The apparatus of claim 1, wherein the base includes a substrate on which the device is fabricated.

6. The apparatus of claim 5, further comprising:
   at least one electrically conductive via extending from a first surface of the substrate to a second surface of the substrate; and
   at least one electrically conductive ball connected to the electrically conductive via.

7. The apparatus of claim 1, wherein the base includes a dielectric material.

8. The apparatus of claim 1, further comprising an electrically conductive bump between the exposed portion of the lead and the device.

9. The apparatus of claim 1, wherein the body of the cover includes liquid crystal polymer.

10. The apparatus of claim 1, wherein the device includes a semiconductor device.

11. The apparatus of claim 10, wherein the semiconductor device is selected from the group consisting of an integrated circuit, an RF device, and a microwave device.

12. The apparatus of claim 1, wherein the device includes a MMIC.

13. The apparatus of claim 1, wherein the device is selected from the group consisting of a MEMS device, an optoelectronic device, a crystal device, an acoustic wave device, and a capacitor.

14. An apparatus, comprising:

a base;

a device connected to the base;

a cover including a one-piece plastic body and at least one electrically conductive lead, wherein the body overlaps but is not directly connected to the base such that the device is enclosed by the body such that an inner surface of the body of the cover and an upper surface of the device define an air gap therebetween, and wherein the electrically conductive lead includes an exposed portion; and an electrically conductive bump electrically connected between the device and the exposed portion of the electrically conductive lead.

15. An apparatus, comprising:

an electrically conductive baseplate;

a device connected to the baseplate; and a cover including a one-piece plastic body and at least one electrically conductive lead, wherein the body overlaps but is not directly connected to the baseplate such that the device is enclosed by the body, and wherein the electrically conductive lead includes an exposed portion electrically connected to the device via an electrically conductive bump.

16. The apparatus of claim 15, wherein the device includes a semiconductor device.

17. The apparatus of claim 16, wherein the semiconductor device is selected from the group consisting of an integrated circuit, an RF device, and a microwave device.

18. The apparatus of claim 15, wherein the device includes a MMIC.

19. The apparatus of claim 15, wherein:

the device includes a GaAs substrate; and the baseplate includes a metal selected from the group consisting of CuW and Cu/Mo/Cu.

20. The apparatus of claim 19, wherein the body of the cover includes liquid crystal polymer.

21. The apparatus of claim 20, wherein an inner surface of the body of the cover and an upper surface of the device define an air gap therebetween.

22. The apparatus of claim 21, wherein the inner surface of the body of the cover includes a sidewall connected to the baseplate.

\* \* \* \* \*